(12) United States Patent
Widzgowski et al.

(10) Patent No.: US 9,450,118 B2
(45) Date of Patent: Sep. 20, 2016

(54) DETECTOR APPARATUS

(75) Inventors: Bernd Widzgowski, Dossenheim (DE); Volker Seyfried, Nussloch (DE); Holger Birk, Meckesheim (DE); Frank Schreiber, Dossenheim (DE)

(73) Assignee: LEICA MICROSYSTEMS CMS GMBH, Wetzlar (DE)

( * ) Notice: Subject to any disclaimer, the term of this patent is extended or adjusted under 35 U.S.C. 154(b) by 394 days.

(21) Appl. No.: 14/238,849

(22) PCT Filed: Aug. 15, 2012

(86) PCT No.: PCT/EP2012/065967
§ 371 (c)(1),
(2), (4) Date: Apr. 25, 2014

(87) PCT Pub. No.: WO2013/024123
PCT Pub. Date: Feb. 21, 2013

(65) Prior Publication Data
US 2014/0306098 A1    Oct. 16, 2014

(30) Foreign Application Priority Data

Aug. 16, 2011 (DE) .................. 10 2011 052 738
Feb. 29, 2012 (DE) .................. 10 2012 101 675
Feb. 29, 2012 (DE) .................. 10 2012 101 679

(51) Int. Cl.
| | |
|---|---|
| *H01J 40/16* | (2006.01) |
| *H01L 31/024* | (2014.01) |
| *H01J 40/02* | (2006.01) |
| *H01J 43/02* | (2006.01) |
| *H01J 43/28* | (2006.01) |

(52) U.S. Cl.
CPC ............. *H01L 31/024* (2013.01); *H01J 40/02* (2013.01); *H01J 40/16* (2013.01); *H01J 43/02* (2013.01); *H01J 43/28* (2013.01)

(58) Field of Classification Search
CPC .......... H01J 40/02; H01J 40/16; H01J 43/02; H01J 43/28
USPC .................... 250/238, 239, 339.04
See application file for complete search history.

(56) References Cited

U.S. PATENT DOCUMENTS

| | | |
|---|---|---|
| 3,139,733 A | 7/1964 | Mayer et al. |
| 3,814,964 A | 6/1974 | Ace |
| 4,833,889 A | 5/1989 | Harwell et al. |
| 4,926,227 A | 5/1990 | Jensen |
| 4,995,236 A | 2/1991 | Rouquier et al. |

(Continued)

FOREIGN PATENT DOCUMENTS

| | | |
|---|---|---|
| CN | 85101204 A | 1/1987 |
| CN | 101793970 A | 8/2010 |

(Continued)

*Primary Examiner* — Kevin Pyo
(74) *Attorney, Agent, or Firm* — Leydig, Voit & Mayer, Ltd.

(57) ABSTRACT

A detector apparatus that is embodied to receive light and to generate electrical signals has a housing and a detector arranged in the housing. The detector includes a light sensor that is embodied to receive light and to release electrons. The light sensor is at a lower electrical potential level than the housing; and that the detector is in thermally conductive contact with the housing via an electrically insulating intermediate arrangement, the thermal conduction direction inside the housing being opposite to the light propagation direction of the light to be detected.

24 Claims, 13 Drawing Sheets

(56) References Cited

U.S. PATENT DOCUMENTS

| | | |
|---|---|---|
| 5,311,044 A | 5/1994 | Iwanczyk et al. |
| 5,508,740 A | 4/1996 | Miyaguchi et al. |
| 5,596,228 A | 1/1997 | Anderton et al. |
| 5,796,109 A * | 8/1998 | Frederick ............ G01T 1/2002 250/361 R |
| 6,133,569 A | 10/2000 | Shoda et al. |
| 6,705,388 B1 | 3/2004 | Sorgo |
| 6,818,885 B2 | 11/2004 | Negi et al. |
| 7,265,340 B2 | 9/2007 | Minamio et al. |
| 8,153,981 B2 * | 4/2012 | Jones .................... G01T 1/20 250/361 R |
| 8,253,093 B2 | 8/2012 | Liedtke et al. |
| 2004/0135071 A1 | 7/2004 | Negi et al. |
| 2004/0238741 A1 | 12/2004 | Gat et al. |
| 2010/0193693 A1 | 8/2010 | Jones et al. |
| 2011/0032614 A1 | 2/2011 | Liedtke et al. |

FOREIGN PATENT DOCUMENTS

| | | |
|---|---|---|
| DE | 102009036066 A1 | 2/2011 |
| EP | 1541979 A1 | 6/2005 |
| JP | 11329338 A | 11/1999 |
| WO | WO 9959186 A1 | 11/1999 |

\* cited by examiner

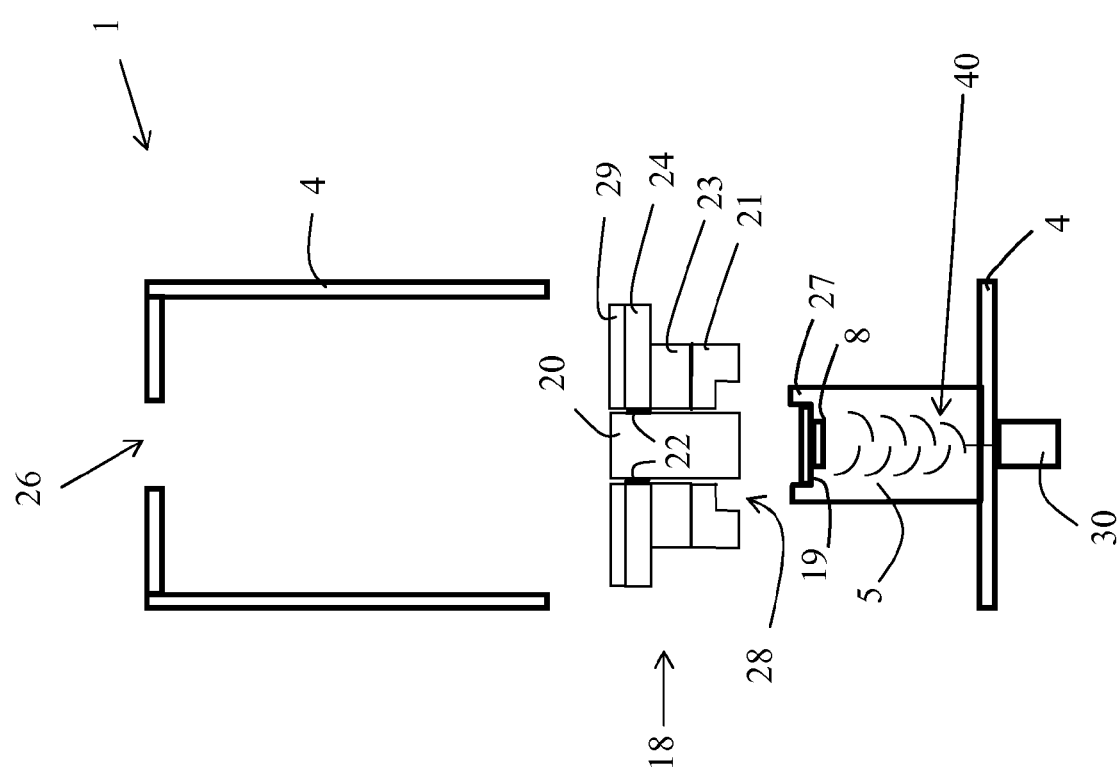

DETECTOR APPARATUS

CROSS REFERENCE TO RELATED APPLICATIONS

This application is a U.S. National Phase application under 35 U.S.C. §371 of International Application No. PCT/EP2012/065967 (WO 2013/024123 A1), filed on Aug. 15, 2012, and claims benefit to German Patent Application Nos. DE 10 2011 052 738.9, filed Aug. 16, 2011, DE 10 2012 101 675.5, filed Feb. 29, 2012, and DE 10 2012 101 679.8, filed Feb. 29, 2012.

FIELD

The invention relates to a detector apparatus configured to receive light and to generate electrical signals.

BACKGROUND

Detector apparatuses of the kind recited above often have a temperature-dependent dark current that causes noise. This dark current can be reduced by cooling.

DE 10 2009 036 066 A1 discloses an optoelectronic detector that comprises a cooling apparatus, namely a Peltier element, thermally conductively connected to the detector. To avoid the occurrence of condensed water on a surface of the optoelectronic detector, a sensor is provided in order to ascertain an instantaneous value with regard to the ambient relative humidity and ambient dew point temperature. The sensor is connected to a control unit that controls the cooling apparatus as a function of the value. This optoelectronic detector has the advantage that cooling is not entirely dispensed with. It has the disadvantage, however, that the actual cooling output is limited to a small amount, namely the amount at which no condensation occurs. The result of this is that detector noise is only insufficiently avoided.

The same document mentions another detector apparatus in which the detector is encapsulated along with the cooling apparatus, typically a Peltier element, in an airtight housing that is filled with a dry gas or evacuated. With this apparatus, the waste heat of the cooling apparatus can be delivered to a cooling element that is thermally conductively connected to the cooling apparatus and/or can be used to heat other components, for example an entrance window of the housing. This detector is to be considered disadvantageous, however, since the airtight encapsulation is complex.

It has in fact been found in practical use that this detector apparatus has even further disadvantages. In particular, cooling is often not very effective. Cooling moreover turns out to be particular difficult if the detector must be at a different electrical potential level than the housing. In this case the Peltier element cannot easily be arranged between the housing and detector. A potential difference of this kind is usually necessary when acceleration of photoelectrons is to occur inside the detector.

U.S. Pat. No. 5,508,470, U.S. Pat. No. 5,596,228, or U.S. Pat. No. 4,833,889, for example, disclose detector apparatuses in which an active cooling apparatus is provided respectively on that side of a light sensor which faces away from a light incidence side. These detector apparatuses have the disadvantage that a large portion of the cooling output is unused and lost.

WO 99/59186 also discloses a detector apparatus having a cooling system, namely a detector apparatus having a photomultiplier cooled by means of a Peltier element.

SUMMARY

In an embodiment, the present invention provides a detector apparatus configured to receive light and to generate electrical signals, the detector apparatus comprising a housing inside of which a direction of thermal conduction is opposite a direction of propagation of light that the detector apparatus is configured to receive, an electrically insulating intermediate arrangement, a detector arranged in the housing and in thermally conductive contact with the housing via the intermediate arrangement, and a light sensor, which is included in the detector, maintained at a lower electrical potential than the housing, and configured to receive light and to release electrons.

In an additional embodiment, the present invention provides an optical apparatus comprising a detector apparatus configured to receive light and to generate electrical signals, the detector apparatus comprising a housing inside of which a direction of thermal conduction is opposite a direction of propagation of light that the detector apparatus is configured to receive, an electrically insulating intermediate arrangement, a detector arranged in the housing and in thermally conductive contact with the housing via the intermediate arrangement, and a light sensor, which is included in the detector, maintained at a lower electrical potential than the housing, and configured to receive light and to release electrons.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIG. 13 is a schematic exploded view of the eighth exemplifying embodiment of the detector apparatus according to the present invention.

DETAILED DESCRIPTION

Figure 1:
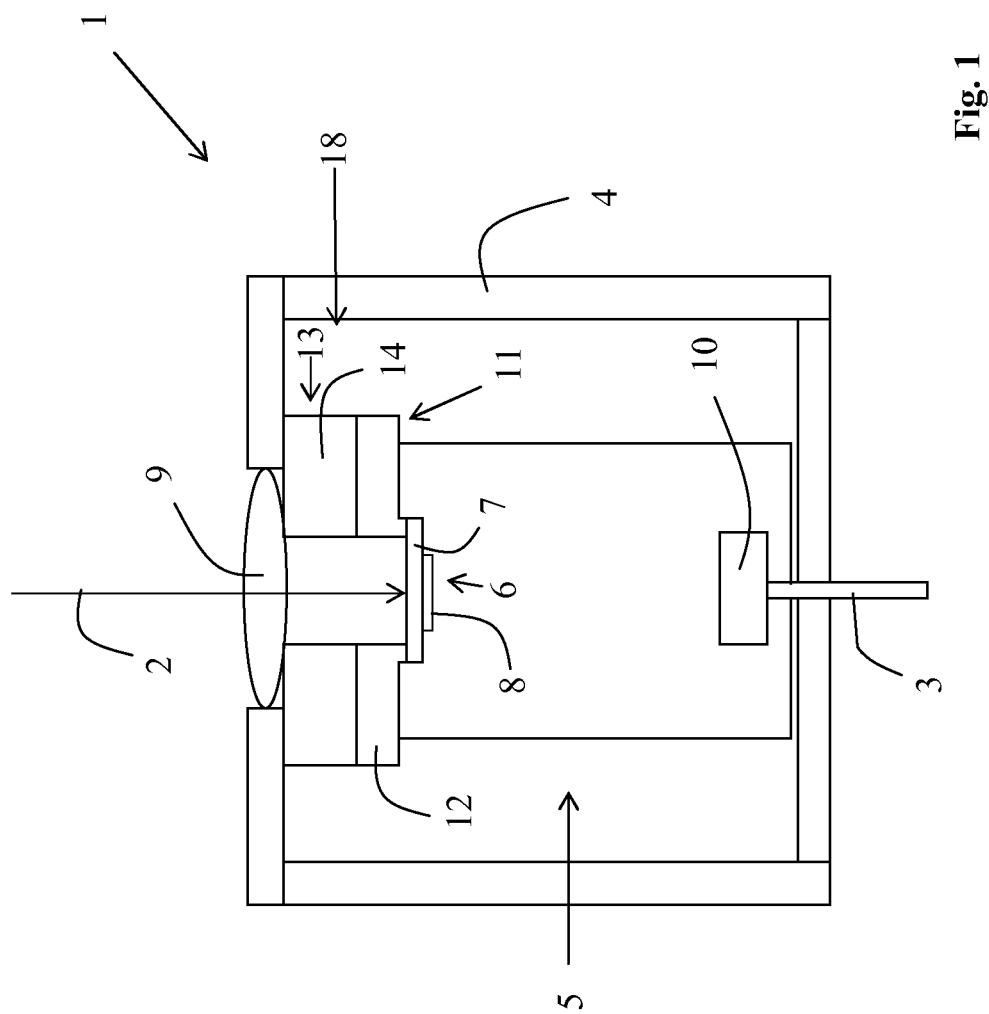
FIG. 1 schematically shows an exemplifying embodiment of a detector apparatus according to the present invention, FIG. 2 schematically shows another exemplifying embodiment of a detector apparatus according to the present invention, FIG. 3 schematically shows a third exemplifying embodiment of a detector apparatus according to the present invention, and FIG. 4 schematically shows a fourth exemplifying embodiment of a detector apparatus according to the present invention.

An aspect of the present invention is to describe a detector apparatus that enables detection of light, in particular of light proceeding from a microscopic sample, with a particularly good signal-to-noise ratio.

In an embodiment, the present invention provides a detector apparatus of the kind recited previously which is characterized in that the light sensor is at a lower electrical potential level than the housing; and that the detector is in thermally conductive contact with the housing via an electrically insulating intermediate arrangement, the thermal conduction direction inside the housing being opposite to the light propagation direction of the light to be detected.

A detector apparatus according to an embodiment of the present invention makes possible efficient cooling that at least greatly reduces the occurrence of disruptive and signal-distorting dark currents.

In an embodiment, the detector apparatus comprises a photomultiplier (PMT) detector as a detector. In a PMT detector of this kind, photons strike a photocathode and release electrons from its surface as a result of the external photoelectric effect. These released photoelectrons are accelerated in an electric field and strike further electrodes or dynodes.

In an embodiment, the detector apparatus has the particular advantage that because the light sensor, for example a photocathode, is at a lower electrical potential level, high acceleration of the released electrons is enabled in simple fashion and largely without additional components, as in the case of a dynode cascade of a photomultiplier. Disruptive and signal-distorting influences of additional components are thereby effectively avoided.

In an embodiment, provision is made that the electrons released by the light sensor are accelerated over an acceleration distance in free-flying fashion inside the detector by means of exclusively one single acceleration stage. Provision can in particular also be made that the electrons released by the light sensor are accelerated over an acceleration distance in free-flying fashion inside the detector by means of exclusively one single acceleration stage with an acceleration voltage of more than 1500 V, in particular more than 2000 V, in particular more than 4000 V, in particular more than 6000 V, in particular approximately 8000 V.

In another embodiment, provision is made that the electrons released from a light-sensitive medium are multiplied with the aid of several acceleration stages, and the current resulting therefrom is then measured, as in the case of the aforementioned PMT detector.

In order to generate a sufficiently large detection signal, provision can advantageously be made that the acceleration stage has downstream from it an absorber for multiplying the number of electrons and/or an avalanche diode that is operated below its breakdown voltage.

The intermediate arrangement is preferably embodied to having high-voltage strength and electrical breakdown strength. Particular components and materials can be used to achieve this, some of which are mentioned and described below by way of example.

A detector apparatus according to an embodiment of the present invention can be constructed in such a way that the potential difference between the light sensor and the housing is more than 1500 V, in particular more than 2000 V, in particular more than 4000 V, in particular more than 6000 V, in particular approximately 8000 V. A detector apparatus of this kind is capable of delivering detection signals that have appreciably less noise than signals from systems having photomultipliers.

The intermediate arrangement is preferably arranged between a light sensor plane of the light sensor and an entrance opening plane of the housing, in which opening plane an entrance opening for the light to be detected is present. Provision can be made here that the light to be detected passes through the intermediate arrangement, for example through a transparent block, in particular a glass block, integrated into the intermediate arrangement, or through a passthrough conduit. Provision can alternatively also be made that the intermediate arrangement is arranged between a light sensor plane of the light sensor and an entrance opening plane of the housing, in which opening plane an entrance opening for the light to be detected is present, and that the light to be detected travels past the intermediate arrangement to the light sensor.

In an embodiment, the detector comprises a dedicated detector housing, the intermediate arrangement being arranged between the housing and the detector housing.

Provision can be made in particular that the intermediate arrangement and the detector housing engage mechanically into one another and/or that the detector comprises a dedicated detector housing having a peripheral protrusion that engages into a peripheral groove of the intermediate arrangement or of a component of the intermediate arrangement. These embodiments have the advantage of particular mechanical stability. In particular, with these embodiments there is no risk of unintentional mutual misalignment of the components.

As already mentioned, provision can advantageously be made that the light path for the light to be detected extends inside the housing preferably entirely through glass, in particular a glass block, in particular through quartz glass, and/or that the intermediate arrangement comprises at least one glass block, in particular made of quartz glass, through which the light path for the light to be detected extends. The result is largely to avoid deposition of dirt or condensation on the light path, and to avoid unintentional attenuation or deflection of the light to be detected.

In an embodiment the light path is interrupted by a gap that serves to compensate for manufacturing tolerances and as a thermally insulating element. This gap can be filled with a gas, with a transparent thermally and electrically insulating liquid, or with a transparent, flexible, thermally insulating solid. The medium in the gap can take on the function of an immersion medium, and can thus decrease reflections at the glass surfaces and increase the optical efficiency.

Particularly efficient cooling of the light sensor is achieved in an embodiment in which the intermediate arrangement is in direct contact, on the light incidence side of the light sensor, with the light sensor and/or with a substrate carrying the light sensor.

As already mentioned, provision can advantageously be made that a light path is defined for the light to be detected, which path extends through the intermediate arrangement, in particular through a cooling component of the intermediate arrangement or past the intermediate arrangement. Symmetrical and uniform cooling of the light sensor, in particular on its light incidence side, can thereby be achieved, thereby considerably improving dark-current behavior.

In an embodiment, provision is made that the light sensor and the housing are thermally conductively connected by means of the intermediate arrangement, the contact area of the intermediate arrangement with the light sensor being smaller than the contact area of the intermediate arrangement with the housing. Such an embodiment has the very particular advantage that on the one hand particularly good heat transport away from the light sensor is guaranteed, while on the other hand free access to the light-sensitive surface of the light sensor for the light to be detected is at most slightly restricted.

In an embodiment, the intermediate arrangement comprises several cooling components that are stacked in layer fashion. The cooling components can in particular be of annular configuration, so that a passthrough conduit for the light to be detected is present. A transparent block, in particular a glass block, through which the light to be detected proceeds can in particular also be arranged in the passthrough conduit.

Provision can in particular be made in this regard that the intermediate arrangement comprises several annular cooling components that are stacked in layer fashion, and that the annular cooling components surround a glass block, made in particular of quartz glass, through which the light path for the light to be detected extends.

In an embodiment, the intermediate arrangement comprises several annular cooling components that are stacked in layer fashion. Provision can be made here in particular that the stack direction extends parallel to the heat transport direction.

In an embodiment, provision can be made that at least two cooling components are arranged coaxially with one another. Provision can be made here in particular that the light path for the light to be detected extends along the rotational symmetry axis of the cooling components. Provision can moreover advantageously be made that the intermediate arrangement is in contact with an entrance window, or with an entrance optic, of the housing. An arrangement of this kind is notable for the fact that a light sensor of the detector can be cooled particularly effectively because direct heat transport occurs from the light sensor, or its substrate, to the housing.

Provision can advantageously be made in particular that the intermediate arrangement comprises several cooling components that are arranged thermally in series. In particular, provision can very particularly advantageously be made that one of the cooling components is embodied as a passive cooling component, for example as a boron nitride ring, and is in direct contact with a light sensor and/or with a light-sensor-carrying substrate.

In an embodiment, provision is made particularly advantageously that at least one of the cooling components is embodied as a thermally conductive, electrically insulating intermediate element, and/or that at least one of the cooling components is embodied as a passive cooling component through which a heat flux takes place.

Alternatively or additionally, provision can also advantageously be made that at least one of the cooling components is embodied as an active cooling component, in particular as a Peltier element or as a heat pump or as a heat pipe. In a very particularly advantageous embodiment, the cooling component is embodied as an annular Peltier element. An embodiment of this kind offers the advantage that the light path for the light to be detected can extend through the center of the ring, so that upon passage through the annular Peltier element, the light path is arranged substantially coaxially with regard to the rotational symmetry axis of the annular Peltier element.

In particular in order to withstand the aforementioned potential differences, in a particular embodiment provision is made that at least one of the cooling components is made at least in part of an electrically insulating and thermally conductive material, in particular of boron nitride, aluminum nitride, aluminum oxide, diamond, synthetic diamond, a flexible thermally conductive material, thermally conductive rubber, or a combination of these materials. These substances are notable on the one hand for high thermal conductivity and on the other hand for very low electrical conductivity. These materials moreover offer the advantage that they can be easily and precisely machined, for example by grinding, lathe-turning, or milling.

In an embodiment, provision is made that at least one of the cooling components is both an electrical insulator and a thermal conductor. In particular in order to achieve this, the cooling component can be made at least in part of a composite material. For example, the cooling component can comprise respectively a core made of a thermally conductive material, for example a metal, for example aluminum or copper, which is surrounded at least in part by an electrical insulator. Provision can be made in particular that the surrounding electrical insulator is thinner, in terms of the thermal conduction direction, than the core. The core can have, in particular, a thickness of several millimeters or even several centimeters.

As a composite component, the cooling component can be manufactured without major outlay even in unusual shapes, in particular because of the easy machinability of a, for example, metallic core.

The core functions on the one hand as a spacer, for example between the light sensor and a housing, or for example between the light sensor and a cooling component embodied in particular as a Peltier element. The block's property of good thermal conductivity is furthermore utilized. In order to bring about electrical insulation, the block is surrounded by an electrical insulator. In a particular embodiment, the electrical insulator is embodied as an insulator film, in particular as a plastic film. The use of a Kapton film is appropriate, for example. Because a suitable plastic film, for example a Kapton film, can already exhibit very high electrical breakdown strength at a thickness of fractions of a millimeter, the electrical insulator film can be embodied to be substantially thinner than the core. The result thereof is in particular that the electrical insulator film has almost no thermal insulating effect. The particular combination of the thermally conductive core with the thinner electrical insulation film results in a cooling component that is both electrically insulating and thermally conductive.

The surrounding electrical insulator can be made of an initially liquid material that is applied, for example by brushing, spraying, or immersion, onto the core and cures thereon.

Provision can be made particularly advantageously that one of the cooling components is embodied as a passive cooling component through which a heat flux takes place. It is particularly advantageous if the passive cooling component exhibits good thermal conductivity, in order to ensure rapid heat transport. Provision can in that regard advantageously be made that the intermediate arrangement or at least one of the cooling components has a thermal conductivity greater than 1 W/mK, in particular greater than 10 W/mK, in particular greater than 100 W/mK, very particularly greater than 500 W/mK.

In an embodiment, the intermediate arrangement or at least one of the cooling components of the intermediate arrangement is shaped and dimensioned in such a way that it can conform in accurately fitting fashion, over as large an area as possible, against that component of the detector apparatus which is to be cooled, in particular against a light sensor and/or against a light-sensor-carrying substrate. Particularly good cooling is thereby achieved. The same is true analogously for the cause in which one of the cooling components is embodied as an active cooling component. The conformation of the intermediate arrangement is, however, preferably always such that operation of the detector and/or the operation of parts of the detector is not disadvantageously impaired, for example by occluding a light path.

In an embodiment that is usable in particular when the detector and/or parts of the detector are at a different electrical potential level than the housing, the intermediate arrangement or at least one of the cooling components is embodied to be largely electrically insulating. Provision can be made in particular that the intermediate arrangement or at least one of the cooling components has an electrical conductivity lower than $10^{-7}$ S/m, in particular lower than $10^{-8}$ S/m.

In accordance with an independent inventive idea that can also be implemented separately from any specific arrangement and embodiment of the intermediate arrangement, provision is advantageously made, in particular for embodiments in which large potential differences can exist, that the intermediate arrangement or at least one cooling component of the intermediate arrangement comprises a leakage path lengthened by means of a labyrinth and/or by means of ribs and/or by means of at least one groove and/or by means of at least one protrusion, in order to increase leakage current strength at an outer surface.

In an embodiment provision is made that the intermediate arrangement, or at least one cooling component of the intermediate arrangement, comprises at least one circumferential protrusion or at least one circumferential groove, in particular in order to increase leakage current strength. An embodiment of this kind has the particular advantage that the leakage path along the surface of the cooling component or of the further cooling component is lengthened, so that the risk of electrical flashover is at least decreased.

In accordance with an independent inventive idea that can also be implemented separately from any specific arrangement and embodiment of the intermediate arrangement, provision is advantageously made, in particular for embodiments in which large potential differences can exist, that cavities of the intermediate arrangement or of at least one cooling component of the intermediate arrangement are filled with an electrically insulating material. In particular when a thermoelectric converter, in particular a Peltier element, is used, provision can advantageously additionally be made that the filling material is embodied to be both electrically and thermally insulating. In a particular embodiment, a cooling component of the intermediate arrangement is embodied as a thermoelectric converter, in particular as a Peltier element, the cavities of which are filled with epoxy resin or silicone.

By filling the cavities of the cooling component and/or of the further cooling component with an electrically insulating material, it is possible to effectively avoid unintentional voltage flashovers. Flashover of sparks along the surface of internal components, for example of the usually columnar or parallelepipedal semiconductor elements of a Peltier element, can be effectively suppressed thanks to the filling with electrically insulating material.

In particular in order to avoid the occurrence of condensation, provision can advantageously be made that the housing is gas-tight and/or that a vacuum exists in the housing. Provision can also be made, for example, that the gas-tight housing is filled with a gas, preferably a dry gas, whose dew point is particularly low. It can be advantageous, for example, to introduce a desiccant into the housing. This serves to remove any residual moisture still present, or to absorb penetrating moisture.

In a particular embodiment, provision is made that the intermediate arrangement is arranged in such a way that the waste heat of the detector, and/or of an (in particular, active) cooling component, heats at least one entrance window of the housing and/or one entrance optic of the housing. The result is that, advantageously, the waste heat of the active cooling component is used in order to avoid the occurrence of condensation on the entrance window or the entrance optic.

In an embodiment that cools particularly efficiently, a passive cooling component is provided which conveys heat from the light sensor and/or from the substrate of the light sensor to a further, active cooling component, in particular a Peltier element, that is not in direct contact with the light sensor or with a substrate of the light sensor. Provision is additionally made that the further, active cooling component delivers heat indirectly or directly to the housing. The result of the particular sequence of the arrangement is that the additional process heat of the active cooling component does not need to directed through the passive cooling component.

A detector apparatus according to an embodiment of the present invention can be used with or in a microscope, in particular a scanning microscope or a confocal scanning microscope. In a very particularly advantageous embodiment of a confocal scanning microscope, the latter comprises several of the detector apparatuses according to embodiments of the present invention. Provision can be made, for example, that different detection spectral regions are and/or can be allocated to the individual detector apparatuses.

Further aspects, advantages, features, and possible applications of the present invention are apparent from the description below of an exemplifying embodiment with reference to the drawings. All the features described and/or graphically depicted constitute, individually or in any useful combination, the subject matter of the present invention, independently of their grouping in the claims or their internal references.

FIG. 1 shows a detector apparatus 1 that is embodied to receive light 2 and to make electrical signals available at an electrical output 3. Detector apparatus 1 comprises a housing 4 in which a detector 5 is arranged.

Detector 5 comprises a light sensor 6, namely a photocathode 8 arranged on a substrate 7, that is operated in a transmission configuration. This means that photocathode 8 receives light 2 to be detected on the side which faces toward an entrance optic 9 of housing 4, and that photocathode 8 emits photoelectrons on the side facing away from that side.

Photocathode 8 and its substrate 7 are at a potential level of −8000 V, while housing 4 is at a potential level of 0 V.

Detector 5 furthermore comprises an avalanche diode 10 that is at a potential level of −400 V with respect to housing 4. The photoelectrons generated by photocathode 8 are accelerated as a result of the potential difference existing between photocathode 8 and avalanche diode 10, and strike an avalanche diode 10 that outputs electrical signals via electrical output 3. This type of detector can be, for example, a hybrid detector.

An electrically insulating intermediate arrangement 18 is installed in such a way that detector 5 is in thermally conductive contact with housing 4 via intermediate arrangement 18, the thermal conduction direction inside housing 4 being opposite to the light propagation direction of light 2 to be detected.

Detector apparatus 1 comprises, inside housing 4, a cooling component 11 that is embodied as a passive cooling component. Cooling component 11 is embodied concretely as a thermally conductive, electrically insulating intermediate element 12. Intermediate element 12 has an annular shape, the center axis of the intermediate element extending coaxially with the light path of light 2 to be detected.

Detector apparatus 1 furthermore comprises, inside housing 4, a further cooling component 13 that is embodied as a preferably annular Peltier element 14. The annular Peltier element 14 is arranged coaxially with the annular intermediate element 12. The Peltier element and intermediate element 12 do not obligatorily need to be annular, but it is advantageous if the Peltier element and intermediate element 12 are arranged coaxially with one another.

The annular Peltier element 14 is in thermally conductive contact with intermediate element 12. Intermediate element 12 is in thermally conductive contact with substrate 7.

The cooling output for cooling substrate 7 and photocathode 8 can be utilized particularly effectively by way of the thermally conductive, electrically insulating intermediate element 12. Provision is furthermore made that the hot side of the annular Peltier element 14 faces toward housing 4 and toward entrance optic 9. The result is that entrance optic 9 becomes heated, so that condensation cannot become deposited. The remaining cavity between detector 5, intermediate element 12, and the annular Peltier element 14 with respect to housing 4 is filled with a thermally and electrically insulating sealant (e.g. silicone). The region between entrance optic 9 and photocathode 8 is filled with a dry gas.

Figure 2:
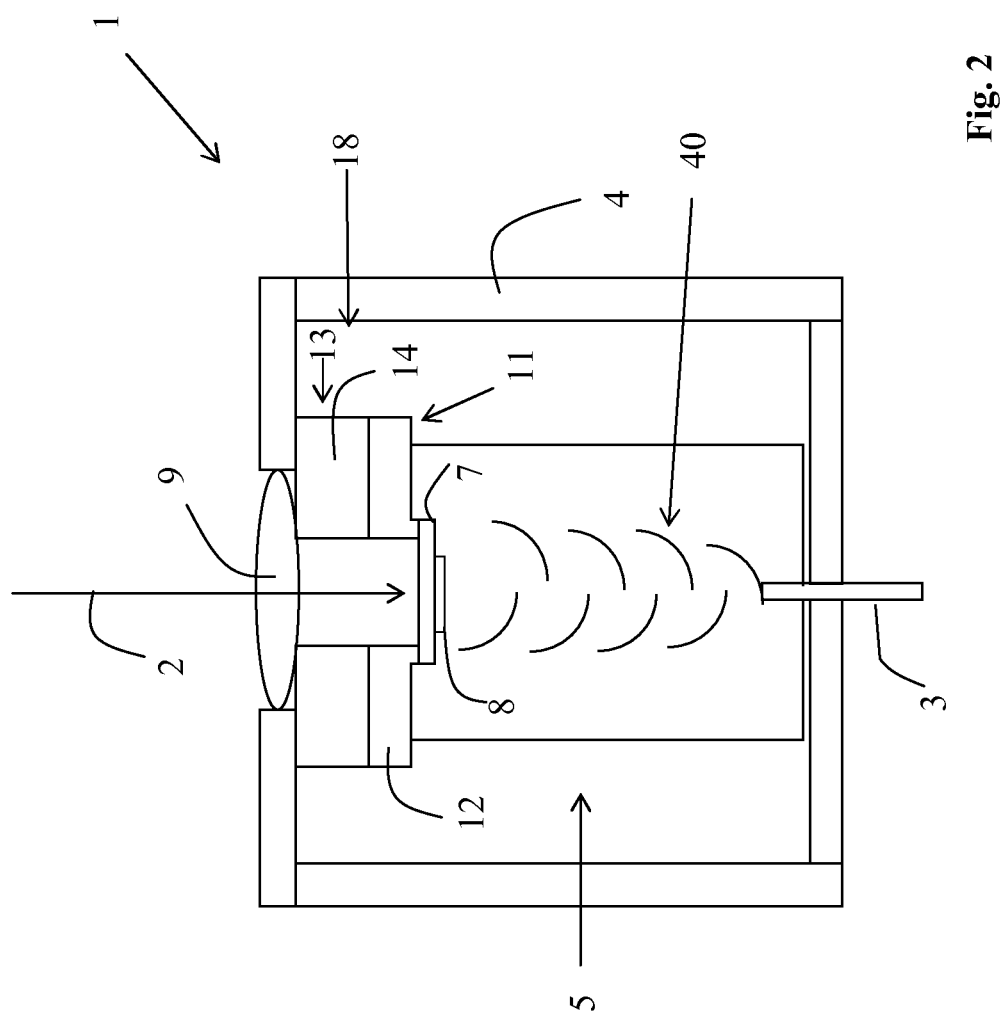

FIG. 2 shows another exemplifying embodiment of the detector apparatus according to the present invention. As with the exemplifying embodiment of FIG. 1, FIG. 2 shows a detector apparatus 1 that is embodied to receive light 2 and to make electrical signals available at an electrical output 3. Detector apparatus 1 comprises a housing 4 in which a detector 5, configured differently from the one shown in FIG. 1, is arranged.

Detector 5 comprises a light sensor that is made up of a light-sensitive layer 7 that is arranged, in a particular embodiment, on a substrate 7. This type of detector can be, for example a photomultiplier (PMT). In a PMT detector of this kind, photons strike photocathode 8 and release electrons from its surface as a result of the external photoelectric effect. These released photoelectrons are accelerated in an electric field and strike further electrodes in dynode cascade 40.

An electrically insulating intermediate arrangement 18 is installed in such a way that detector 5 is in thermally conductive contact with housing 4 via intermediate arrangement 18, the thermal conduction direction inside housing 4 being opposite to the light propagation direction of light 2 to be detected.

Detector apparatus 1 comprises, inside housing 4, a cooling component 11 that is embodied as a passive cooling component. Cooling component 11 is embodied concretely as a thermally conductive, electrically insulating intermediate element 12. Intermediate element 12 has an annular shape, the center axis of the intermediate element extending coaxially with the light path of light 2 to be detected.

Detector apparatus 1 furthermore comprises, inside housing 4, a further cooling component 13 that is embodied as an annular Peltier element 14. The annular Peltier element 14 is arranged coaxially with the annular intermediate element 12. Here as well, the Peltier element and intermediate element 12 do not obligatorily need to be annular, but they should preferably be arranged coaxially with one another. The Peltier element and/or the intermediate element could be made up of several parts.

The annular Peltier element 14 is in thermally conductive contact with intermediate element 12. Intermediate element 12 is in thermally conductive contact with substrate 7.

The cooling output for cooling substrate 7 and photocathode 8 can be utilized particularly effectively by way of the thermally conductive, electrically insulating intermediate element 12. Provision is furthermore made that the hot side of the annular Peltier element 14 faces toward housing 4 and toward entrance optic 9. The result is that entrance optic 9 becomes heated, so that condensation cannot become deposited. The remaining cavity between detector 5, intermediate element 12, and the annular Peltier element 14 with respect to housing 4 is filled with a thermally and electrically insulating sealant (e.g. silicone). The region between entrance optic 9 and photocathode 8 is filled with a dry gas.

Figure 3:
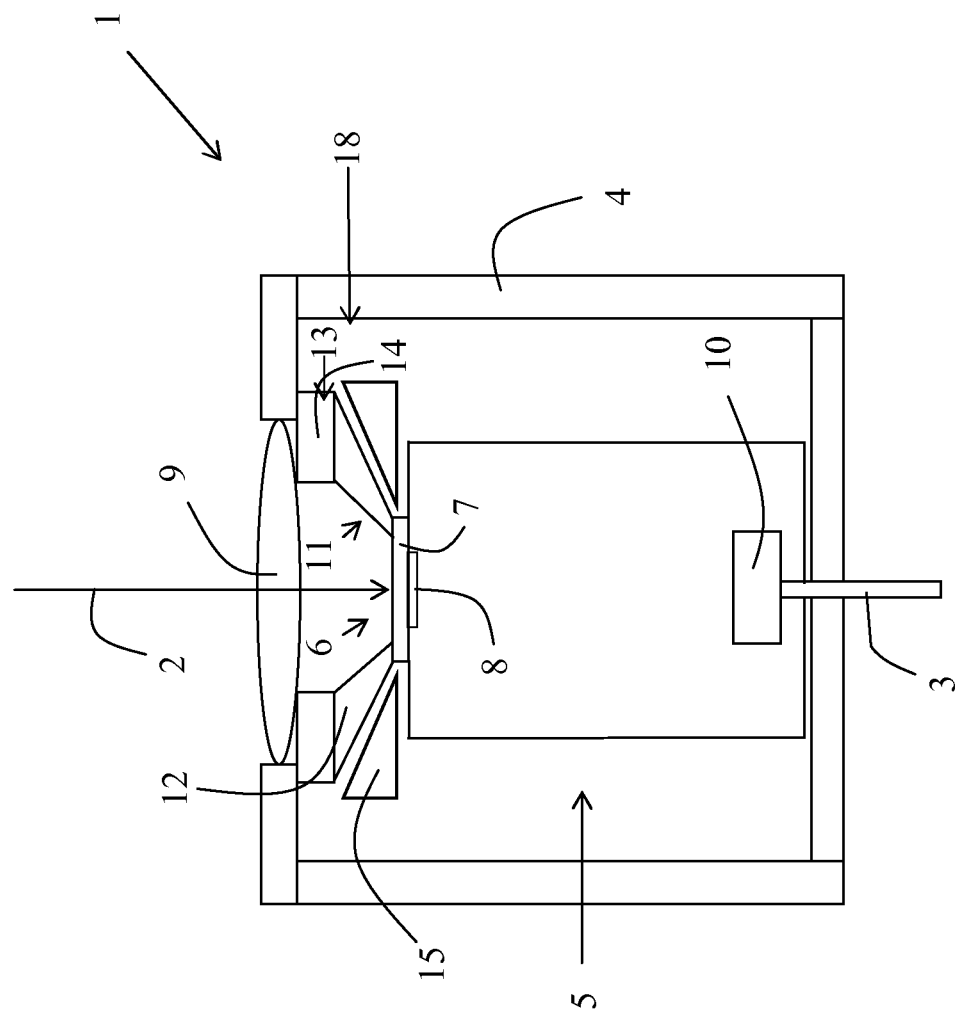

FIG. 3 schematically shows a third exemplifying embodiment of a detector apparatus according to the present invention that substantially corresponds in terms of basic construction to the detector apparatuses shown in FIGS. 1 and 2. Cooling component 11, however, which is embodied as a thermally conductive, electrically insulating intermediate element 12, comprises a conical passage for light 2 to be detected. Further cooling component 14 is moreover provided with a passage of enlarged diameter (as compared with the embodiments that are shown in FIGS. 1 and 2). An enlarged entrance window 9 of housing 4 is moreover installed. This embodiment has the particular advantage that the numerical aperture is substantially increased. The result is that, in particular, even obliquely incident light can travel without impediment to the light sensor embodied as photocathode 8.

In particular, the entrance window is embodied to be substantially larger than the light sensor, in this example photocathode 8. The radius of the clear opening of cooling component 11 and of further cooling component 13 thus increases, proceeding from photocathode 8 toward the entrance window. The additional result of this is that the contact area between cooling component 11 (embodied as intermediate element 12) and further cooling component 14 (i.e. Peltier element 14) is substantially enlarged, which in particular ensures good heat dissipation.

In the embodiment depicted in FIG. 3, the contact area between cooling component 11 and substrate 7 of light sensor 6 is also larger than the contact area between cooling component 11 and further cooling component 13, although cooling component 11 is not directly in contact with further components of detector 5. For this, in particular, the outer contour of cooling component 11 is also of conical configuration.

In order to bring about additional thermal insulation relative to the housing, an annular thermal insulator 15 that surrounds cooling component 11 is provided.

Figure 4:
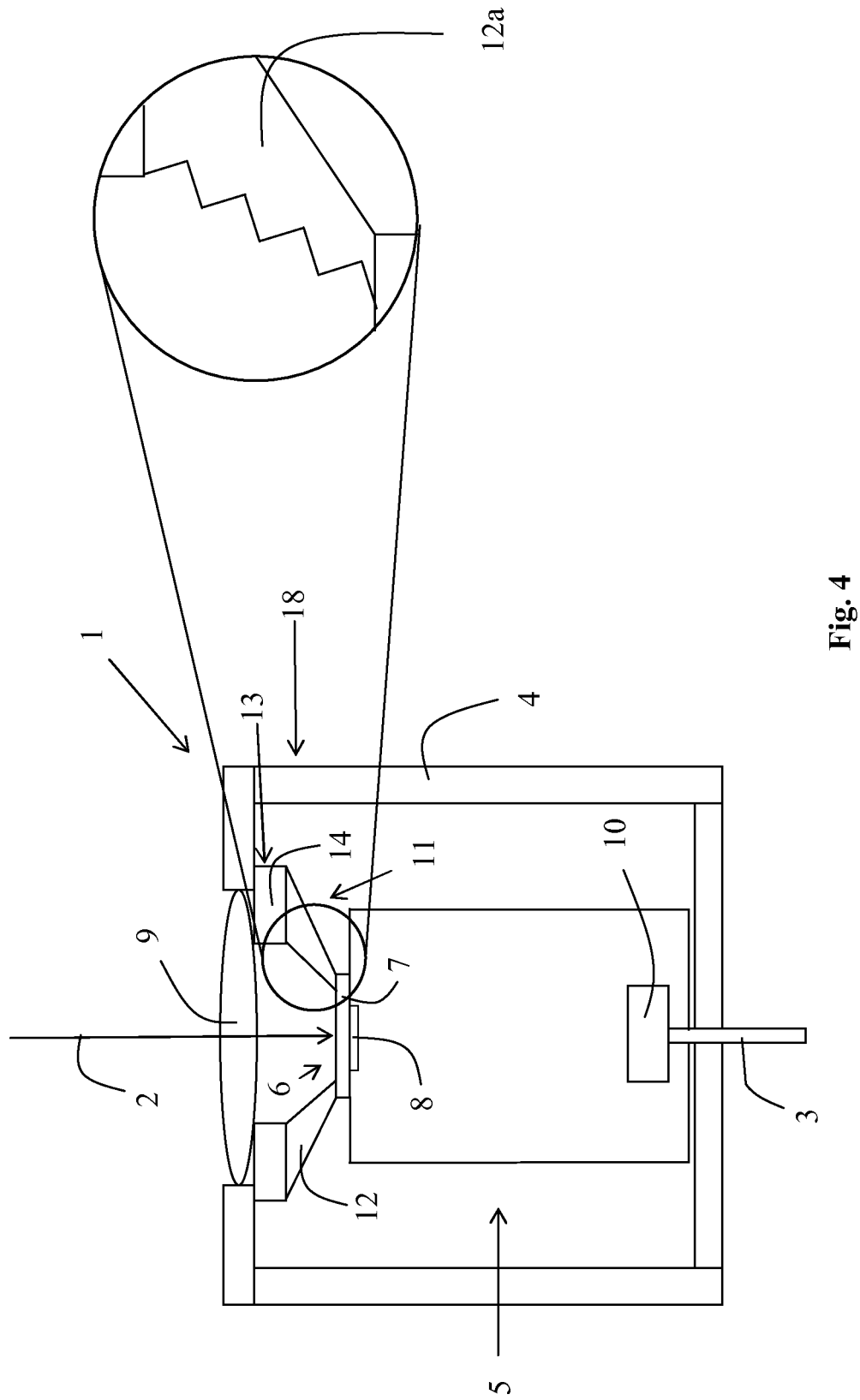

FIG. 4 schematically shows a fourth exemplifying embodiment of a detector apparatus according to the present invention that corresponds in terms of its essential construction to the embodiment shown in FIG. 3. In order to increase leakage current strength, the passage for light 2 of intermediate element 12 is equipped with a circumferential rib structure 12a. The leakage path from light sensor 6 to further cooling component 13 is thereby lengthened, and the risk of an electrical flashover thus substantially reduced.

Figure 5:
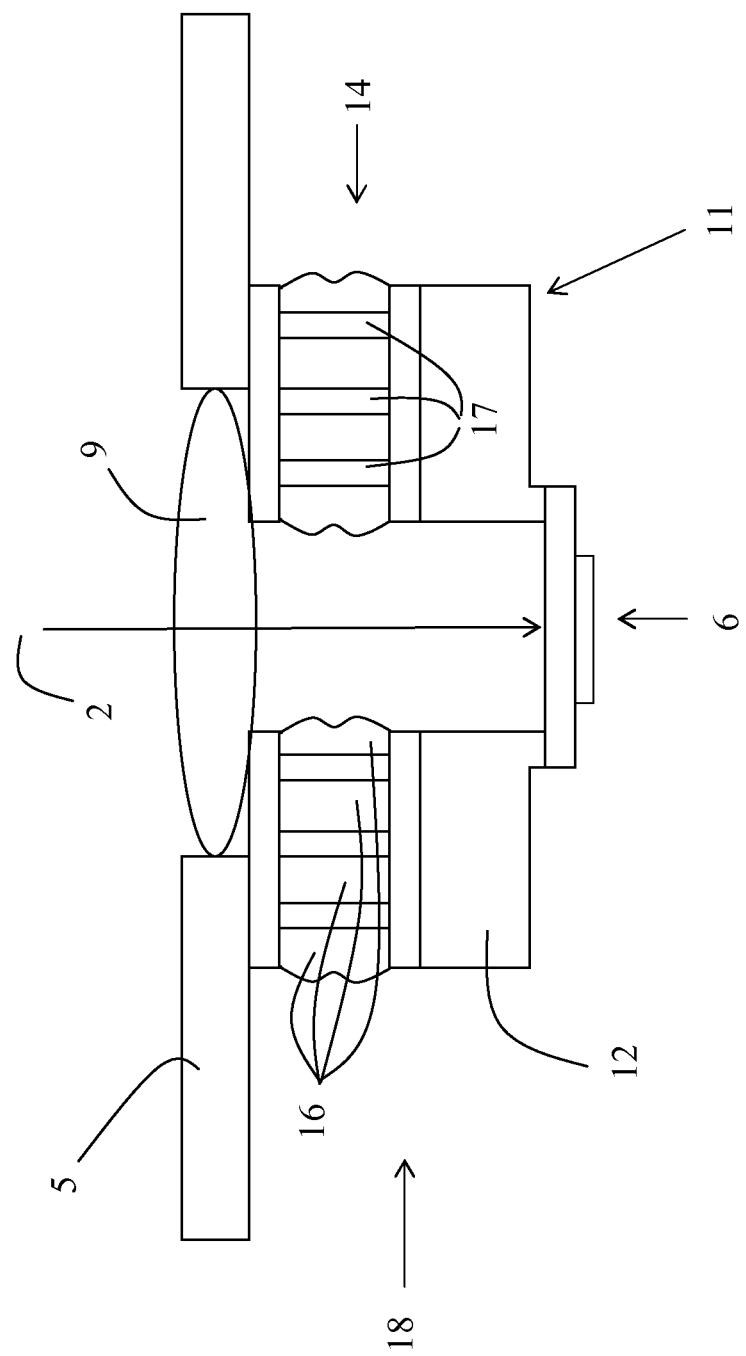
FIG. 5 depicts a detail of an exemplifying embodiment of an intermediate arrangement of the detector apparatus according to the present invention, FIG. 6 schematically shows a fifth exemplifying embodiment of a detector apparatus according to the present invention, FIG. 7 schematically shows a sixth exemplifying embodiment of a detector apparatus according to the present invention.

FIG. 5 depicts in detail an exemplifying embodiment of an intermediate arrangement of the detector apparatus according to the present invention. In this exemplifying embodiment the cavities of further cooling component 13, namely of Peltier element 14, are filled with an electrically insulating material 16, for example with silicone. By filling the cavities with an electrically insulating material 16, it is possible to effectively avoid unintentional voltage flashovers. Flashover of sparks along the surface of internal components, for example the columnar or parallelepipedal semiconductor elements 17 of Peltier element 14, can be effectively suppressed thanks to the filling with electrically insulating material 16.

In addition, electrically insulating material 16 is provided with ribs on the outer side and in the region of the passage for light 2, in order to lengthen the leakage path.

Figure 6:
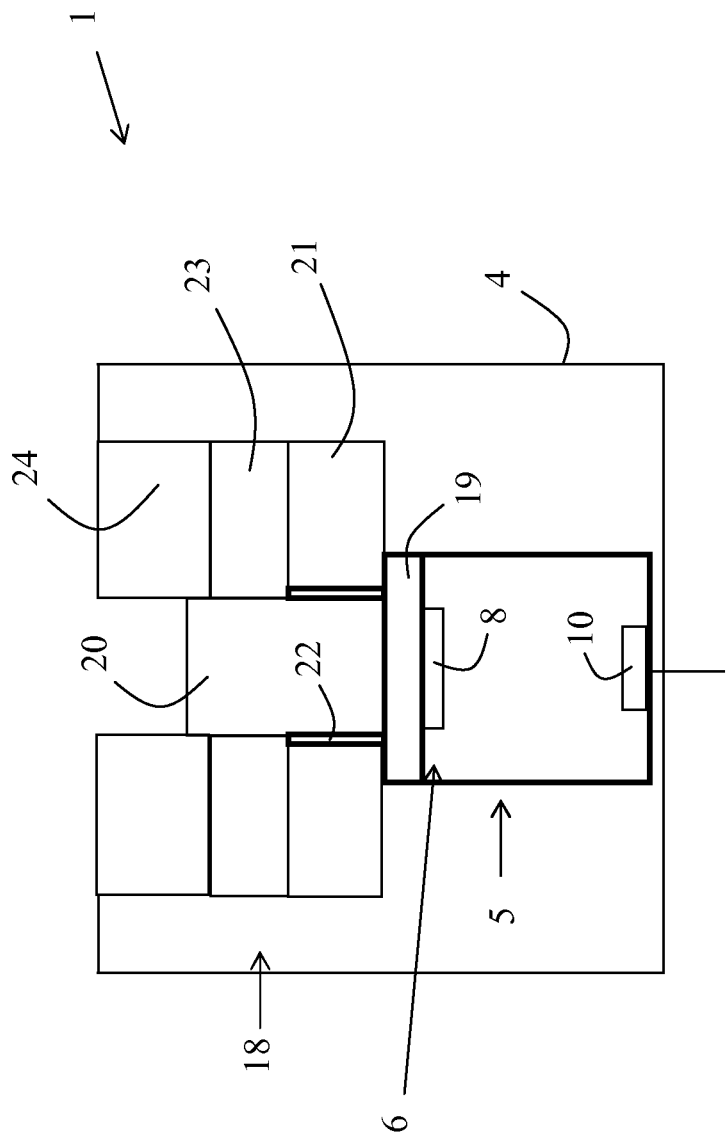

FIG. 6 schematically shows a fifth exemplifying embodiment of detector apparatus 1 according to the present invention.

Detector apparatus 1 comprises a housing 4 in which a detector 5 is arranged. Detector 5 contains, as light sensor 6, a photocathode 8 that is operated in a transmission configuration and is at a lower electrical potential level than housing 4. Downstream from the photocathode is an avalanche diode 10 that is reached by the electrons released as a result of light irradiation after passing through the acceleration distance located therebetween.

An electrically insulating intermediate arrangement 18 is installed in such a way that detector 5 is in thermally conductive contact with housing 4 by way of intermediate arrangement 18, the thermal conduction direction inside housing 4 being opposite to the light propagation direction of light 2 to be detected.

Arranged immediately in front of light sensor 6, viewed from the light irradiation direction, is a transparent substrate, in this case a plane-parallel glass disk 19, namely a borosilicate glass disk. Arranged in front of glass disk 19 is a transparent glass block 20 through which the light to be detected passes before it reaches light sensor 6.

Intermediate arrangement 18 comprises several annular cooling components, which are arranged in a stack arrangement coaxially with one another and in which glass block 20 is arranged. Arranged immediately adjacent to the plane-parallel glass disk 19 is a passive cooling component, namely an aluminum nitride ring 21, that is bonded with an adhesive 22 to glass block 20. Adhesive 22 is embodied to have high-voltage strength and is made preferably of an epoxy resin having a breakdown strength of 20 KV/mm.

An annular Peltier element 23 is installed adjacently to aluminum nitride ring 21 as a further cooling component. A thermally conductive medium, for example a copper ring 24, is located between the annular Peltier element 23 and housing 4.

The open spaces between detector 5 and intermediate arrangement 18 on the other hand, and housing 4 on the other hand, are preferably filled with silicone.

Figure 7:
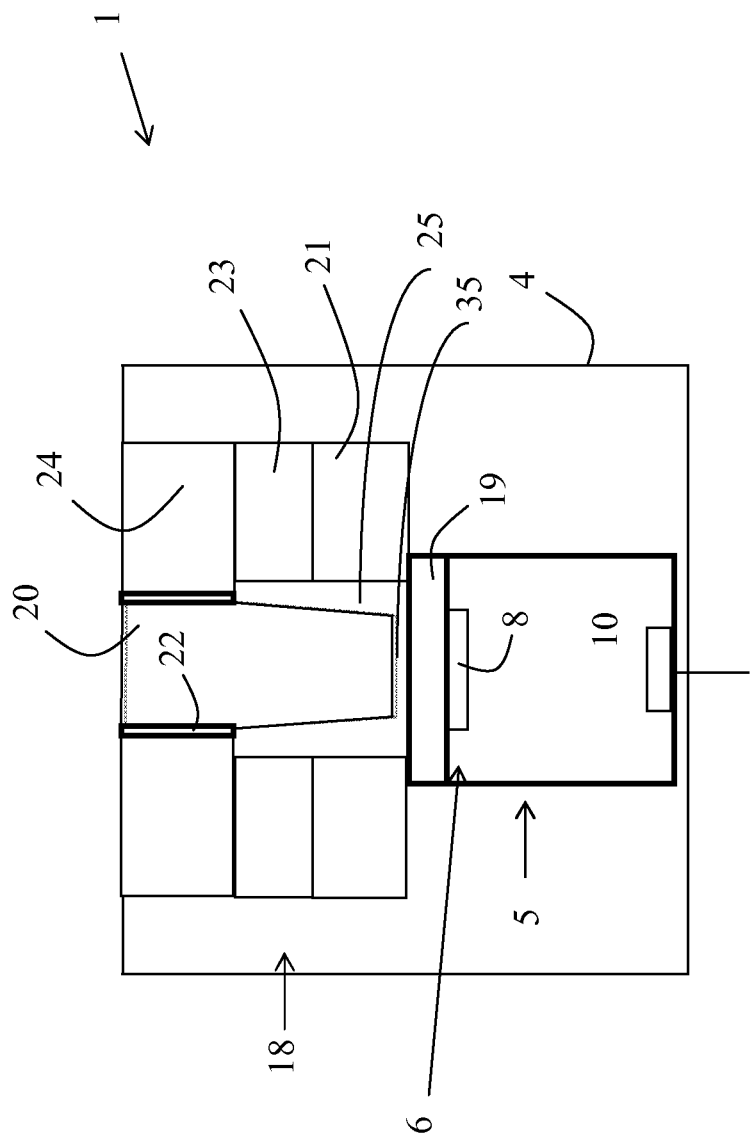

FIG. 7 schematically shows a sixth exemplifying embodiment of a detector apparatus 1 according to the present invention that differs from the embodiment depicted in FIG. in terms of the shape and arrangement of glass block 20. A transparent substrate, in this case a glass plate 19, is arranged directly in front of light sensor 6 (viewed from the light irradiation direction).

In the embodiment depicted in FIG. 7, glass block 20 is of frustoconical configuration, the end having the smaller diameter facing toward light sensor 6. The end having the larger diameter forms the entrance window of detector apparatus 1, and preferably terminates flush with housing 4. Glass block 20 is connected to the hot side of the cooling element so that condensation of ambient moisture cannot in any case take place on its outer side. Glass is a poor thermal conductor. Some heat is nevertheless transported inward.

In order to minimize heat input into glass plate 19, an air gap 35 is present between glass block 20 and glass plate 19. This air gap furthermore serves to compensate for manufacturing tolerances that might otherwise cause an application of force onto glass plate 19. Glass block 20 is slightly warmer than the environment in the interior of the detector. Despite the air gap, a little thermal energy is transferred to the surface of glass plate 19 facing toward it. Glass plate 19 is therefore slightly warmer at the center than at the edge, and also warmer than cooling component 11. Any residual moisture therefore becomes deposited on cooling component 11 or at the edge of glass plate 19. The center, and thus the light path through glass plate 19, therefore remain unaffected by condensation problems.

In order to avoid condensation problems as a result of residual moisture in air gap 35 or in the remaining open volume 25, they can be filled with a dry gas or with a transparent electrically and thermally insulating medium (e.g. silicone oil). This medium can at the same time also be embodied so that it decreases refractive index discontinuities, for example from air to glass and vice versa, and thus reduces optical losses. It would accordingly take on the function of an immersion medium.

In the embodiment depicted in FIG. 7, glass block 20 is bonded to the copper ring with a flashover-resistant adhesive 22.

Figure 8:
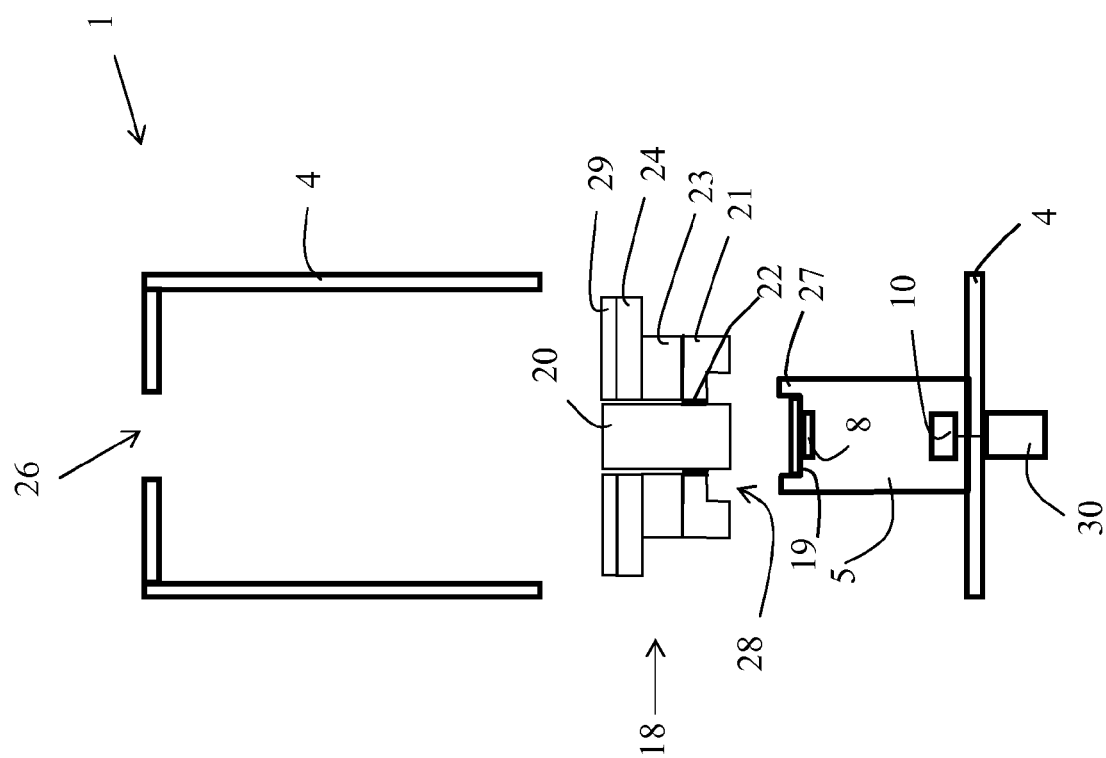
FIG. 8 is a schematic exploded view of the fifth exemplifying embodiment of the detector apparatus according to the present invention.

FIG. 8 is a schematic exploded depiction of the construction of the fifth exemplifying embodiment of detector apparatus 1 according to the present invention.

Detector apparatus 1 comprises a housing 4 in which a detector 5 is arranged. Detector 5 contains, as light sensor 6, a photocathode 8 that is operated in a transmission configuration and is at a lower electrical potential level than housing 4. Downstream from the photocathode is an avalanche diode 10 that is reached by the electrons released as a result of light irradiation after passing through the acceleration distance located therebetween.

An electrically insulating intermediate arrangement 18 is installed in such a way that detector 5 is in thermally conductive contact with housing 4 by way of intermediate arrangement 18, the thermal conduction direction inside housing 4 being opposite to the light propagation direction of light 2 to be detected.

Detector 5 comprises a circumferential protrusion 27 that is directed toward an entrance opening 26 for the light to be detected and engages into a circumferential groove 28 of intermediate arrangement 18. Groove 28 is located between an aluminum nitride ring 21 into which a chamfer is milled, and a glass block 20 which is adhesively bonded into aluminum nitride ring 21 and through which the light to be detected passes.

An annular Peltier element 23 is installed adjacent to aluminum nitride ring 21 as a further cooling component.

Located adjacent to Peltier element 23 is a thermally conductive element, e.g. a copper ring 24, whose outside diameter is larger than that of Peltier element 23. An elastic ring 29 made of a flexible thermally conductive material, for example a rubber material, is located between copper ring 24 and housing 4 for sealing.

The electrical detection signals are outputted via a connector plug 30.

Figure 9:
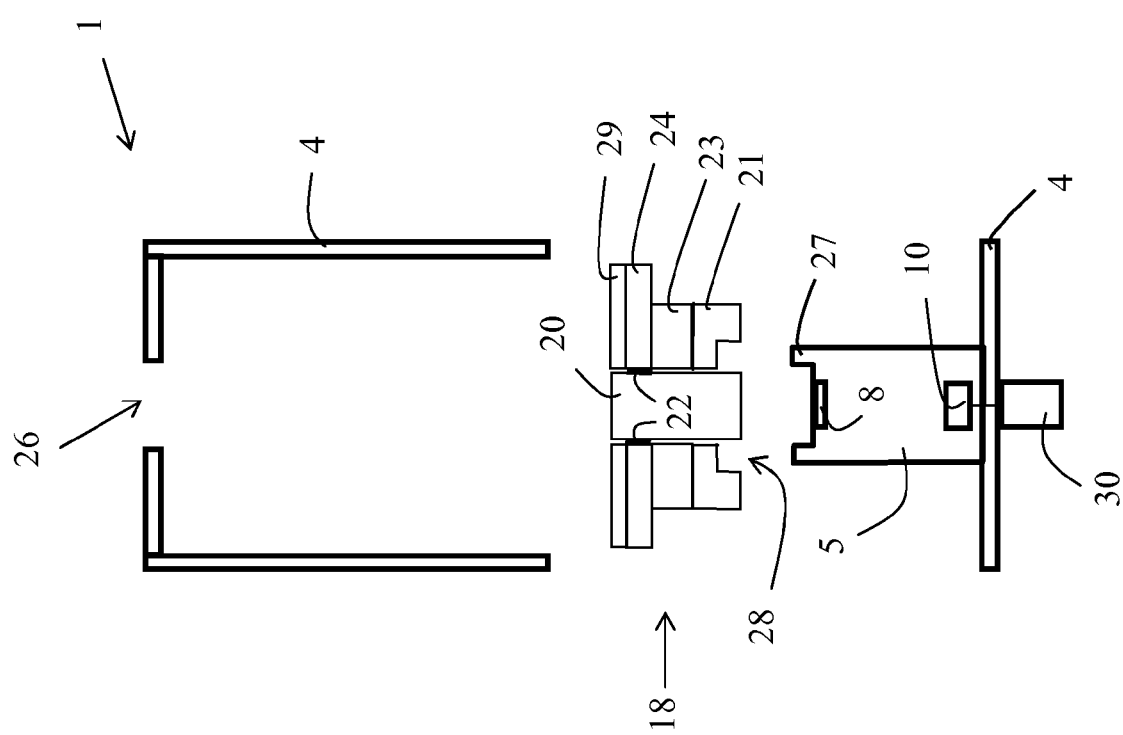
FIG. 9 is a schematic exploded view of the sixth exemplifying embodiment of the detector apparatus according to the present invention, FIG. 10 schematically shows a seventh exemplifying embodiment of a detector apparatus according to the present invention.

FIG. 9 is a schematic expanded depiction of the construction of the sixth exemplifying embodiment and of a depiction of a detector apparatus according to the present invention, which differs from the exemplifying embodiment depicted in FIG. 8 in that the glass block is bonded with an adhesive 22 not to aluminum nitride ring 21 but instead to copper ring 24. A different thermally conductive element 24 can also be used instead of a copper ring. For example, element 24 could be an aluminum nitride ring or another metal ring.

Figure 10:
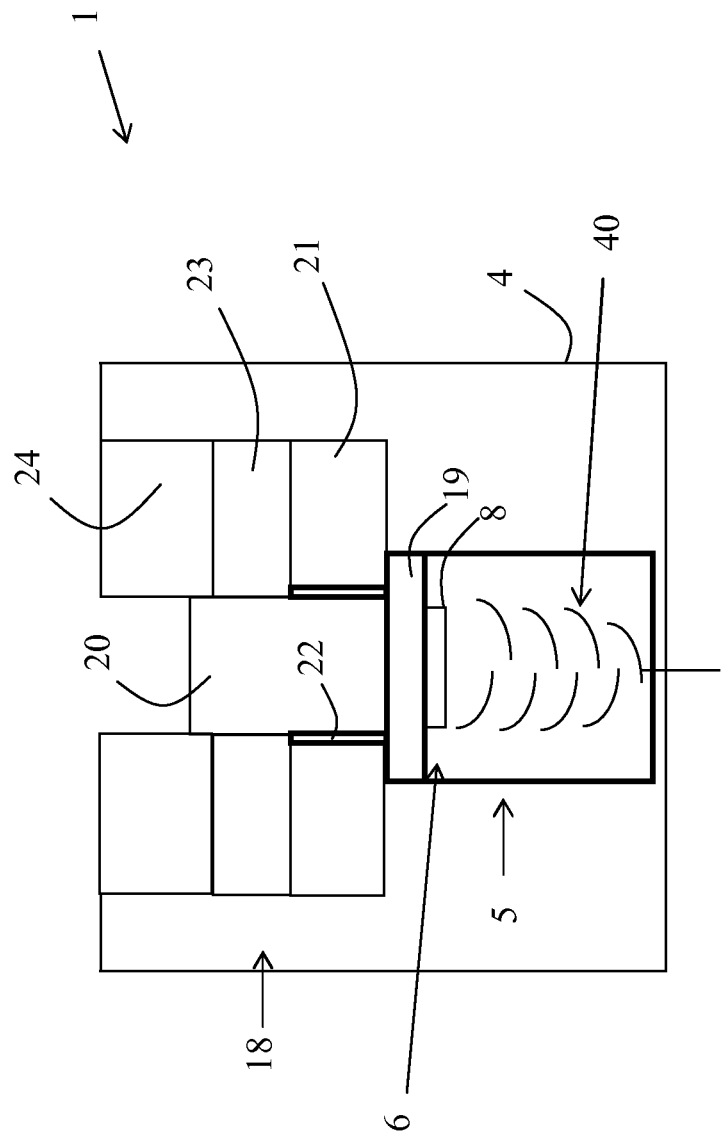

FIG. 10 schematically shows a seventh exemplifying embodiment of a detector apparatus according to the present invention, which differs from the exemplifying embodiment depicted in FIG. 6 in that detector 5 is a PMT detector (for example as in the exemplifying embodiment shown in FIG. 2).

Figure 11:
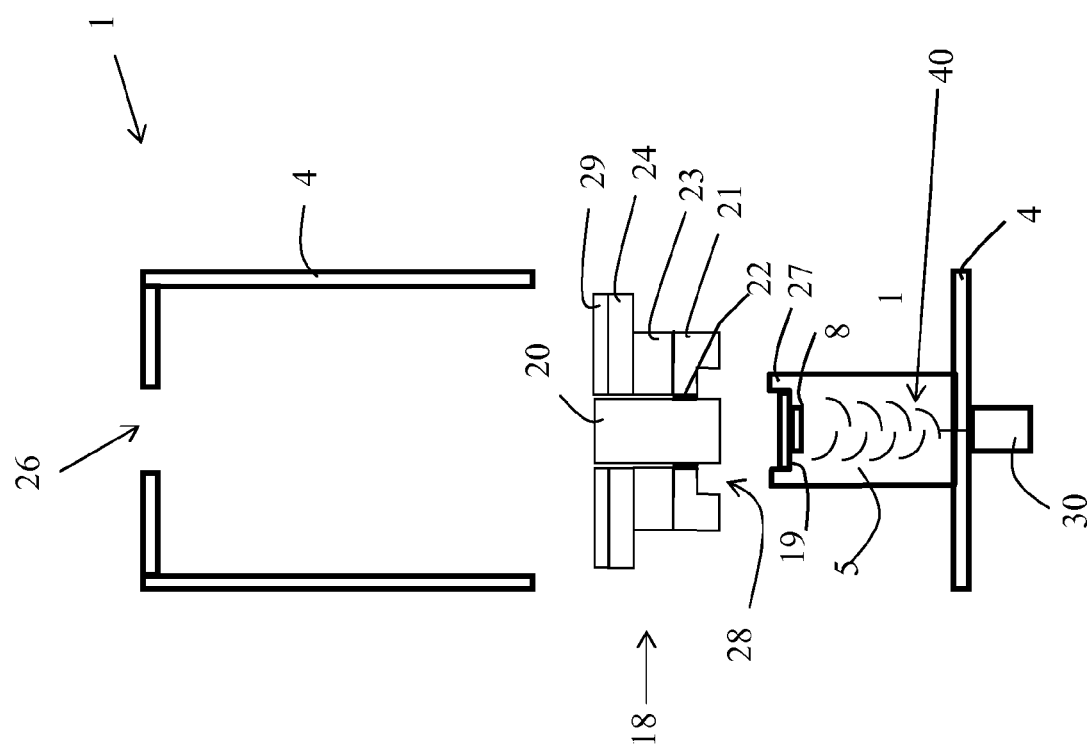
FIG. 11 is a schematic exploded view of the seventh exemplifying embodiment of the detector apparatus according to the present invention, FIG. 12 schematically shows an eighth exemplifying embodiment of a detector apparatus according to the present invention.

FIG. 11 is a schematic exploded depiction of the configuration of the seventh exemplifying embodiment, which differs from the exemplifying embodiment depicted in FIG. 8 in that detector 5 is a PMT detector (for example as in the exemplifying embodiment shown in FIG. 2).

Figure 12:
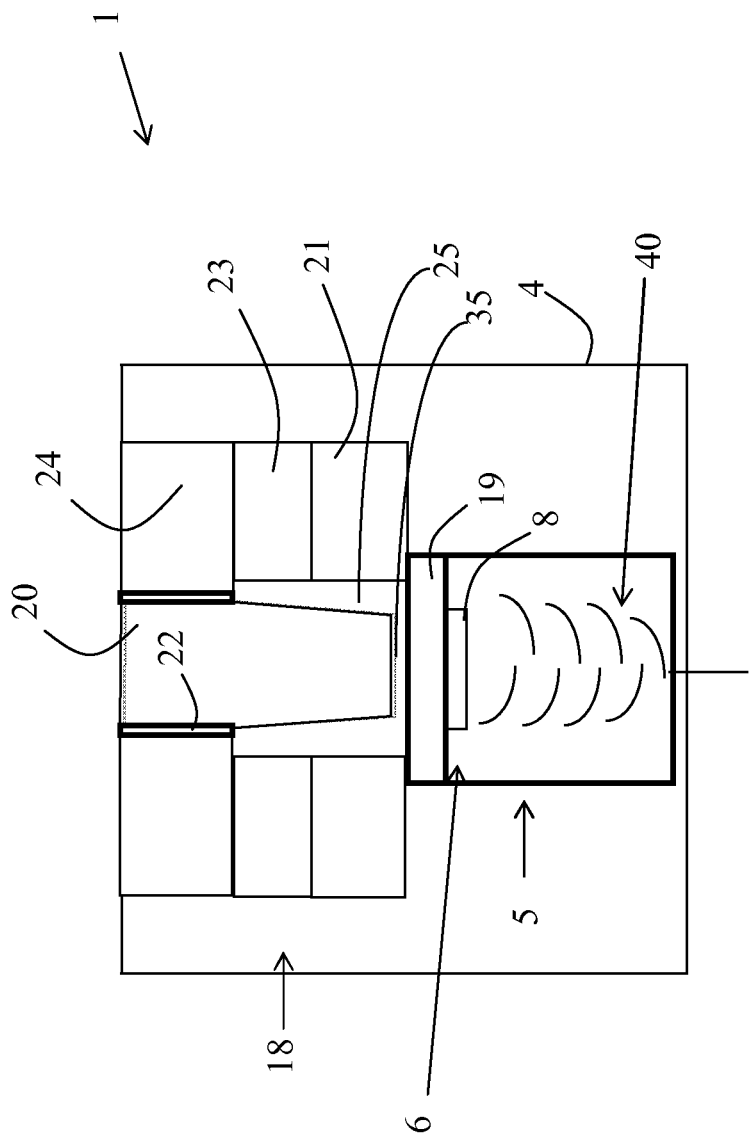

FIG. 12 schematically shows an eighth exemplifying embodiment of the detector apparatus according to the present invention, which differs from the exemplifying embodiment depicted in FIG. 7 in that detector 5 is a PMT detector (for example as in the exemplifying embodiment shown in FIG. 2).

FIG. 13 is a schematic exploded depiction of the configuration of the eighth exemplifying embodiment, which differs from the exemplifying embodiment depicted in FIG. 9 in that detector 5 is a PMT detector (for example as in the exemplifying embodiment shown in FIG. 2). Glass block 20 is adhesively bonded to copper ring 24, rather than to aluminum nitride ring 21 as in FIG. 11. A different thermally conductive element 24 can also be used instead of a copper ring. For example, element 24 could be an aluminum nitride ring or another metal ring.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

REFERENCE SYMBOL LIST

1 Detector apparatus
2 Light to be detected
3 Electrical output
4 Housing
5 Detector
6 Light sensor
7 Substrate
8 Photocathode
9 Entrance optic
10 Avalanche diode
11 Cooling component
12 Intermediate element
12a Rib structure
13 Further cooling component
14 Peltier element
15 Thermal insulator
16 Electrically insulating material
17 Semiconductor elements
18 Intermediate arrangement
19 Glass plate; glass disk
20 Glass block
21 Electrically insulating thermally conductive element; aluminum nitride ring
22 Adhesive
23 Peltier element
24 Thermally conductive element; copper ring
25 Remaining volume
26 Entrance opening
27 Protrusion
28 Groove
29 Elastic thermally conductive ring
30 Connector plug
35 Air gap
40 Dynode cascade

What is claimed is:

1. A detector apparatus configured to receive light and to generate electrical signals, the detector apparatus comprising:
 a housing inside of which a direction of thermal conduction is opposite a direction of propagation of light that the detector apparatus is configured to receive;
 an electrically insulating intermediate arrangement; and
 a detector arranged in the housing and in thermally conductive contact with the housing via the intermediate arrangement, the detector including a light sensor maintained at a lower electrical potential than the housing, and configured to receive light and to release electrons.

2. The detector apparatus according to claim 1, wherein at least one of:
 the electrons released by the light sensor are accelerated by a single acceleration stage over an acceleration distance in free-flying fashion inside the detector,
 the electrons released by the light sensor are accelerated by a single acceleration stage with a voltage greater than 1500 V over an acceleration distance in free-flying fashion inside the detector, or the electrons released front a light-sensitive medium are multiplied with the aid of several acceleration stages, and the current resulting therefrom is then measured.

3. The detector apparatus according to claim 2, further comprising an avalanche diode located downstream from the single acceleration stage, wherein the avalanche diode is operated below its breakdown voltage.

4. The detector apparatus according claim 1, wherein the intermediate arrangement is configured to have high-voltage strength and electrical breakdown strength.

5. The detector apparatus according to claim 1, wherein the potential difference between the light sensor and the housing is greater than 1.500 V.

6. The detector apparatus according to claim 1, wherein the intermediate arrangement is disposed between a light sensor plane of the light sensor and an entrance opening plane of the housing, the entrance opening plane of the housing including an entrance opening for light to be detected.

7. The detector apparatus according to claim 1, wherein the detector comprises a dedicated detector housing; and
wherein at least one of:
the intermediate arrangement is disposed between the housing and the detector housing,
the intermediate arrangement and the detector housing engage mechanically into one another, or
the dedicated detector housing includes a peripheral protrusion that engages a peripheral groove of one of the intermediate arrangement and a component of the intermediate arrangement.

8. The detector apparatus according to claim 1, wherein a light path is defined for the light to be detected, and
wherein the light path extends at least one of through the intermediate arrangement and past the intermediate arrangement.

9. The detector apparatus according to claim 8, wherein the light path extends at least one of:
inside the housing through one of glass, a glass block, and quartz glass, or
through at least one glass block comprised in the intermediate arrangement.

10. The detector apparatus according to claim 8, wherein the light path is interrupted by a gap that serves to at least one of compensate for manufacturing tolerances or act as a thermally insulating element.

11. The detector apparatus according to claim 10, wherein the gap is filled with a medium, and
wherein the medium is at least one of a gas, a transparent thermally and electrically insulating liquid, and a transparent, flexible, thermally insulating solid.

12. The detector apparatus according to claim 1, wherein the intermediate arrangement is in direct contact, on the light incidence side of the light sensor, with at least one of the light sensor or a substrate carrying the light sensor.

13. The detector apparatus according to claim 1, wherein the intermediate arrangement comprises at least one of:
several cooling components that are stacked in layer fashion,
several annular cooling components that are stacked in layer fashion,
several cooling components that are stacked in layer fashion, wherein the stack direction extends parallel to a heat transport direction,
several annular cooling components that are stacked in layer fashion, wherein the annular cooling components surround a glass block through which the light path for the light to be detected extends, or
several cooling components that are arranged them ally in series.

14. The detector apparatus according to claim 13, wherein at least one of the cooling components includes at least one of:
a thermally conductive, electrically insulating intermediate element,
a passive cooling component through which a heat flux occurs, or
a flexible thermally conductive material.

15. The detector apparatus according to claim 13, wherein at least one of the cooling components is an active cooling component, and
wherein the active cooling component is at least one of a Peltier element, a heat pump, or a heat pipe.

16. The detector apparatus according to claim 13, wherein at least one of the cooling components is made at least in part of an electrically insulating and thermally conductive material, and
wherein the electrically insulating and thermally conductive material includes at least one of boron nitride, aluminum nitride, aluminum oxide, diamond, synthetic diamond, or thermally conductive rubber.

17. The detector apparatus according to claim 13, wherein at least one of the cooling components is at least one of:
both an electrical insulator and a thermal conductor,
includes a composite material,
includes a core made of a thermally conductive material which is surrounded at least in part by an electrical insulator wherein the core comprises aluminum and the electrical insulator is an electrical insulator film, or
includes a core made of a thermally conductive material that is surrounded at least in part by an electrical insulator, that is thinner, in terms of the thermal conduction direction, than the core, wherein the core comprises aluminum.

18. The detector apparatus according to claim 1,
wherein the intermediate arrangement includes at least one cooling component, and
wherein at least one of the intermediate arrangement and the at least one cooling component has a thermal conductivity greater than 1 W/mK.

19. The detector apparatus according to claim 1,
wherein the intermediate arrangement includes at least one cooling component, and
wherein at least one of the intermediate arrangement and the at least one cooling component has an electrical conductivity lower than $10^{-7}$ S/m.

20. The detector apparatus according to claims 1,
wherein the intermediate arrangement includes at least one cooling component, and
wherein at least one of the intermediate arrangement and the at least one cooling component exhibits increased leakage current strength at an outer surface as a result of comprising a leakage path lengthened by at least one of a labyrinth, ribs, at least one groove, or at least one protrusion.

21. The detector apparatus according to claims 1,
wherein the intermediate arrangement includes at least one cooling component, and
wherein the intermediate arrangement further includes a plurality of cavities and wherein the plurality of cavities are at least one of:
filled with an electrically insulating material, or
filled with an electrically and thermally insulating material; and wherein the at least one cooling component is a thermoelectric converter comprising at least one of:
- a Peltier element having a plurality of cavities filled with an electrically insulating material,
- a Peltier element having a plurality of cavities filled with an electrically and thermally insulating material, or
- a Peltier element having a plurality of cavities filled with epoxy resin or silicone.

22. The detector apparatus according to claim 1, wherein the first housing is at least one of gas-tight and inclusive of a vacuum.

23. The detector apparatus according to claim 1, wherein the intermediate arrangement is arranged such that waste heat of at least one of the detector and the cooling component heats at least one of:
- an entrance window of the housing, or
- an entrance optic of the housing.

24. An optical apparatus comprising:

detector apparatus configured to receive light and to generate electrical signals, the detector apparatus including:
- a housing inside of which a direction of thermal conduction is opposite a direction of propagation of light that the detector apparatus is configured to receive;
- an electrically insulating intermediate arrangement; and
- a detector arranged in the housing and in thermally conductive contact with the housing via the intermediate arrangement, the detector including a light sensor maintained at a lower electrical potential than the housing, and configured to receive light and to release electrons.

* * * * *